United States Patent [19]

Morita et al.

[11] 4,433,287

[45] Feb. 21, 1984

[54] RANGE SWITCHING DEVICE FOR ELECTRIC METER

[75] Inventors: Akiro Morita; Isamu Watanabe, both of Kawasaki, Japan

[73] Assignee: Riken Denshi Co., Ltd., Kawasaki, Japan

[21] Appl. No.: 242,228

[22] Filed: Mar. 10, 1981

Related U.S. Application Data

[63] Continuation of Ser. No. 37,017, Apr. 27, 1979.

[30] Foreign Application Priority Data

Oct. 12, 1978 [JP] Japan .................................. 53-124617

[51] Int. Cl.³ ........................ G01R 15/08; G01R 1/30
[52] U.S. Cl. .................................. 324/115; 324/123 R
[58] Field of Search ........... 324/115, 98, 99 D, 123 R

[56] References Cited

U.S. PATENT DOCUMENTS 3,284,709 11/1966 De Paolo .............................. 324/98
3,553,580 1/1971 Matthews ............................. 324/115

OTHER PUBLICATIONS

Vassos et al.; Analog and Digital Electronic for Scientists; 1972; Wiley-Interscience, New York; pp. 127, 128, 139, 152, 153, 80, and 81.

Primary Examiner—Ernest F. Karlsen
Attorney, Agent, or Firm—William J. Daniel

[57] ABSTRACT

A range switching device for an electric meter, e.g. voltmeter, having a pair of input terminals, an impedance converting operational amplifier high in input impedance but low in output impedance having its input connected to one of said input terminals, a variable resistance and fixed resistance are connected in series between the output of said amplifier and the other input terminal, and the terminals of an electric meter made high in the input impedance by an impedance converting amplifier are connected across the ends of the fixed resistance, wherein the variable resistance is the aggregate of a plurality of groups of serially connected individual resistors, the individual resistors of each such group having the same resistance value while the resistance values of successive groups are successive multiples to a common base number of the fixed resistance value, each such group having switching contacts between the individual resistors of each group and at the ends of each group for selective engagement by a switch connected to one end of the next group to vary the number of functional individual resistors in that group. The number of individual resistors in each group normally will be one less than the common base number except that the number in the group corresponding to a multiple of one preferably equals the base number less two.

4 Claims, 2 Drawing Figures

RANGE SWITCHING DEVICE FOR ELECTRIC METER

This is a continuation of Ser. No. 34,017, filed Apr. 27, 1979.

BACKGROUND OF THE INVENTION

For purposes of varying the operational range of electric meters such as voltmeters, automatic voltage recorders, and the like, it is known to use a device wherein the ends of a potentiometer are connected between the input terminals of the voltage to be observed and a meter is connected by switching to a voltage dividing end having a selected voltage dividing ratio or the voltage dividing ratio is continuously varied by means of a slider and is set at a selected value with a vernier scale or the like. However, these arrangements are subject to defects in that, in the first case, if the number of range switching levels or steps is too high, a great many values of resistances will be required and will be difficult to manufacture and, in the second case, an accurate setting is difficult and corrective measures are required.

STATEMENTS OF OBJECTS

The present invention has for its object the provision of a range switching device free of such defects wherein the operative range of the meter can be easily switched in a number of steps over a wide spread of voltages.

DETAILED DESCRIPTION OF INVENTION

Figure 1:
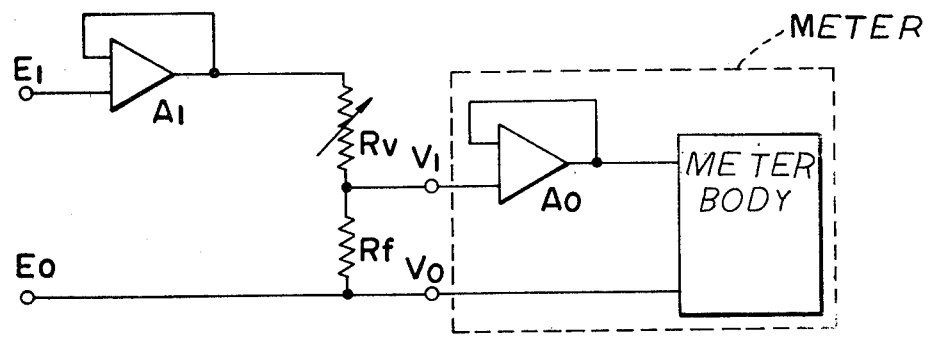
FIG. 1 is a circuit diagram of a preferred embodiment of the present invention in which the meter with an associated operational amplifier is enclosed in dashed lines.

FIG. 1 is a circuit diagram of a preferred embodiment of the present invention wherein a variable resistance $R_v$ and a fixed resistance $R_f$ are connected in series through an impedance converting operational amplifier $A_1$ which is high in input impedance but low in output impedance between the input terminals $E_1$ and $E_0$ for the voltage to be observed, i.e. $e_i$, and an electric meter M such as a voltmeter, automatic voltage recorder or the like is connected across output terminals $V_1$ and $V_0$ which extend from the ends of the fixed resistance $R_f$. The meter M is given a sufficiently high input impedance, as required, by interposing an impedance converting operational amplifier $A_o$ in series between its instrument body B and the terminals $V_1$ and $V_0$.

Figure 2:
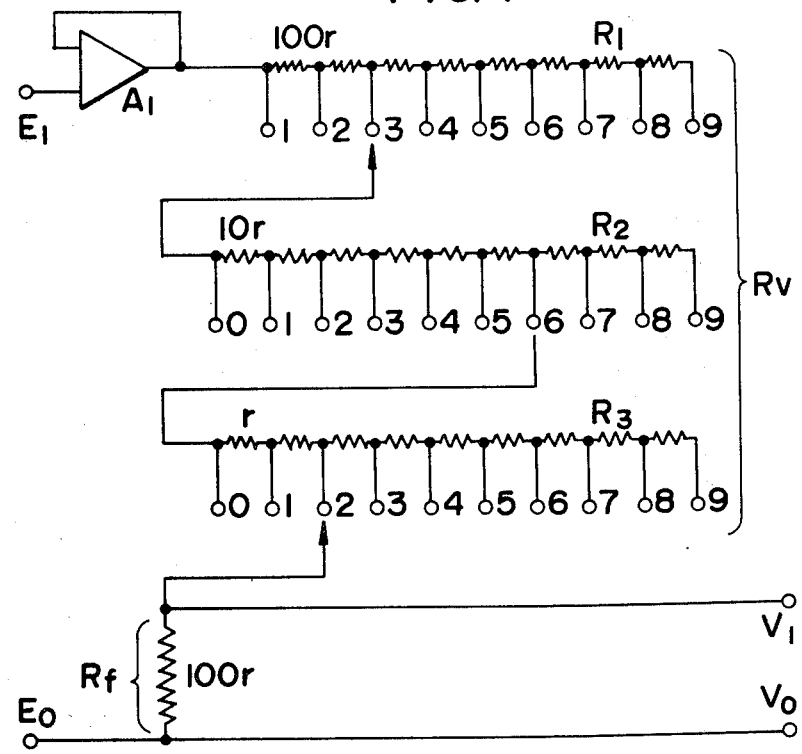
FIG. 2 is a detailed circuit diagram of the portion of FIG. 1 outside the dashed lines. In the diagrams, $E_1$ and $E_0$ are observed voltage input terminals, $V_1$ and $V_0$ are output terminals, M is a meter, B is a body of the meter and $A_1$ and $A_0$ are operational amplifiers.

FIG. 2 is a circuit diagram showing in detail the portion of FIG. 1 outside the dashed lines and illustrating a preferred construction of the resistances $R_v$ and $R_f$ in FIG. 1. The variable resistance $R_v$ is constituted of a plurality of groups of individual resistors, the resistance values of which in successive groups represent successive multiples to a common base number of the value of the fixed resistance. The preferred base number is 10 to permit the switching device to operate according to the decimal system, although other base numbers can be substituted, and in that case each variable resistance group with one preferred exception) will consist of 9 individual resistors with a contact provided at the ends of and between the adjacent resistors of each group. The resistance values of the resistors in each group will be in multiples of 10 with the values in successive groups representing successive multiples of 10. Thus, one group designated $R_1$ serves as a units decade, the next successive group designated $R_2$ serves as the tenths decade, while the third successive group designated $R_3$ represents the hundredths decade, and other decades not shown in the drawings can, of course, be added if desired. Expressed logarithimically, the resistance values of the individual resistors of group $R_1$ equal $10^0 R_f$, the values of group $R_2$ equal $10^{-1} R_f$, and the values of group $R_3$ equal $10^{-2} R_f$, and additional decades would equal $10^x R_f$ where x was the appropriate multiple for that decade. For example, selecting a resistance value for the fixed resistance of $R_f$ of 100r, the individual resistors in the group $R_1$ would have a value of 100r, the individual resistors in group $R_2$ would have the value of 10r, while the resistors in group $R_3$ would have a value of 1r.

A selector switch is associated with each of the resistor groups $R_1$–$R_3$ for adjustment between the switching contacts for that group, which for convenience are numbered from 0-9, each switch being connected in series with one end of the next group, preferably the lowest end, i.e. adjacent the zero switching contact. As the following analysis shows, it is desirable for the "units" group to consist of 8 rather than 9 individual resistors with 9 rather than 10 switching contacts associated therewith, the lowest numbered switching contact being 1 rather than 0. This adjusts for the presence of the fixed resistance $R_f$ in the circuit and its effect in determining the ratio of the input and output voltages from the switching unit. However, other ways of compensating for the presence of $R_f$ could be used if desired.

In the range switching device of the invention, if the voltage applied between the input terminal $E_i$ and $E_o$ is $e_i$, the output voltage $e_o$ appearing between the output terminals $V_i$ and $V_o$ will be $$e_o = e_i \frac{R_f}{R_f + R_v} \quad (I)$$

Therefore, if the full scale voltage of the meter M is $e_{of}$, the full scale $e_{if}$ as seen from the input terminals $E_i$ and $E_o$ will be $$e_{if} = e_{of} \frac{R_f + R_v}{R_f} \quad (II)$$

or $$e_{if} = e_{of} \frac{R_f + R_1 + R_2 + R_3}{R_f} \quad (III)$$

If the location number of the switching contact positions of the resistor decades $R_1$, $R_2$ and $R_3$ are respectively x, y and z and $R_f = 100r$, then equation (III) can be expressed as $$e_{if} = e_{of} \frac{1 R_f + (x-1) R_f + 0.1 y R_f + 0.01 z R_f}{R_f} \quad (IV)$$

so that $$e_{if} = e_o(x + 0.1y + 0.01z) \qquad \text{(V)}$$

If as appears in FIG. 2, x, y and z are selected as 3, 6 and 2, respectively, $e_{if}$ will equal $$e_{if} = 3.62 e_{of} \qquad \text{(VI)}$$

Thus, the magnitude of the observed voltage which will produce a full scale reading on the meter will be 3.62 times the rated full scale voltage of the meter. Further, where each of x, y and z is the maximum 9, $e_{if}$ will be $$e_{if} = 9.99 e_{of}$$

while if they are the minimum 1, 0, and 0, $e_{if}$ will be $$e_{if} = 1.00 e_{if}$$

Thus, in the preferred embodiment as illustrated, the full scale reading of the meter can be freely switched at intervals of 0.01 $v_o$ from $v_o$ to 9.99 $v_o$. By adjusting the switches of the several resistor groups as necessary to give a full scale meter reading, a digital indication of the observed voltage as a function of the rated meter voltage will be given directly by the switching contact positions, i.e. x, y and z. Further, because of the operational amplifier $A_1$, the impedance between the terminals $E_1$ and $E_0$ will be high and will not be influenced by the variation of the resistance $R_v$ and, as the input impedance of the meter M is made high, no range switching magnification error will be produced.

As can be noted from the above description, in the device of the present invention a variety of different range switches can be assembled from resistors of only a few resistance values in that plural resistors of the same resistance value are connected in series. Further, when a digital switch is used to switch between the switching contacts of the respective resistor groups, it can be made to be very small, to be easily incorporated in the meter and to be accurately set.

What is claimed is:

1. A range switching device for a voltage measuring electric meter, said device comprising input terminals for the voltage signal to be observed, an impedance converting operational amplifier high in input impedance but low in output impedance having its input connected to one of said input terminals, and a variable resistance and a fixed resistance connected in series between the output of said amplifier and said other input terminal, said electric meter being connected across the ends of said fixed resistance through an impedance converting operational amplifier to impart high input impedance thereto, said variable resistance comprising a succession of groups of resistors with the resistors in each such group corresponding in number and being connected in series, the individual resistors of each such group having the same resistance value while the resistance values of the resistors in said successive groups are successive multiples to a common base number of the fixed resistance value, switching contacts in the connections between adjacent pairs of individual resistors in each such group and at the respective ends of the series of each such group, a switch for each said group arranged for switching between the switching contacts for that group, and means connecting one end of the first of said resistor groups in such said succession of groups to said amplifier output, means connecting one end of each of the second through the last of such groups to the switch for the next preceding group, and means connecting the switch for the last of said groups to the end of said fixed resistance.

2. The device of claim 1 wherein the number of individual resistors in the group corresponding to a multiple of one equals the base number minus two while the number of resistors in all other groups equals the base number minus one.

3. The device of claim 1 wherein said base number equals 10.

4. The device of claim 3 wherein the number of such groups is three and the multiples thereof are $10^0$, $10^{-1}$, and $10^{-2}$, respectively.

* * * * *